United States Patent
Hamzeh et al.

(10) Patent No.: US 11,165,437 B2
(45) Date of Patent: *Nov. 2, 2021

(54) SYSTEM AND METHODS FOR VIRTUALIZING DELTA SIGMA DIGITIZATION

(71) Applicant: CABLE TELEVISION LABORATORIES, INC, Louisville, CO (US)

(72) Inventors: Belal Hamzeh, Westminster, CO (US); Zhensheng Jia, Superior, CO (US); Luis Alberto Campos, Superior, CO (US); Curtis Dean Knittle, Superior, CO (US); Jing Wang, Broomfield, CO (US)

(73) Assignee: Cable Television Laboratories, Inc., Louisville, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/791,925

(22) Filed: Feb. 14, 2020

(65) Prior Publication Data

US 2020/0186163 A1 Jun. 11, 2020

Related U.S. Application Data

(63) Continuation of application No. 16/180,591, filed on Nov. 5, 2018, now Pat. No. 10,566,994, which is a
(Continued)

(51) Int. Cl.
*H03M 3/00* (2006.01)
*H04B 10/58* (2013.01)
(Continued)

(52) U.S. Cl.
CPC .......... *H03M 3/496* (2013.01); *H03M 3/424* (2013.01); *H03M 3/43* (2013.01);
(Continued)

(58) Field of Classification Search
CPC ........ H03M 3/496; H03M 3/424; H03M 3/43; H03M 3/50; H03M 3/458; H04N 21/6168;
(Continued)

(56) References Cited

U.S. PATENT DOCUMENTS 5,550,544 A 8/1996 Sakiyama et al.
5,982,315 A 11/1999 Bazarjani et al.
(Continued)

FOREIGN PATENT DOCUMENTS

| CA | 3050283 A1 | 7/2018 |
| EP | 2733852 A1 | 5/2014 |
| WO | 2012174513 A2 | 12/2012 |

OTHER PUBLICATIONS

"Data-Over_Cable Service Interface Specifications, DOCSIS 3.1, Physical Layer Specification, CM-SP-PHYv3.1-107-150910," Cable Television Laboratories, Inc., Sep. 10, 2015 (244 pages).
(Continued)

*Primary Examiner* — Kenneth T Lam
(74) *Attorney, Agent, or Firm* — David Daniel Smith; Cable Television Laboratories, Inc.

(57) ABSTRACT

A method for virtually performing delta-sigma digitization is provided. The method is performed on a series of digital samples output from a communication stack of a communication network. The method includes steps of obtaining a delta-sigma digitization sampling frequency for the output series of digital samples, calculating an oversampling ratio for the output series of digital samples, interpolating the output series of digital samples at a rate equivalent to the oversampling ratio, and quantizing the interpolated series of digital samples to plurality of discrete predetermined levels.

20 Claims, 16 Drawing Sheets

Related U.S. Application Data continuation-in-part of application No. 15/875,336, filed on Jan. 19, 2018, now Pat. No. 10,805,058, which is a continuation of application No. 15/847,417, filed on Dec. 19, 2017, now Pat. No. 10,763,963.

(60) Provisional application No. 62/581,166, filed on Nov. 3, 2017, provisional application No. 62/448,044, filed on Jan. 19, 2017, provisional application No. 62/435,961, filed on Dec. 19, 2016.

(51) Int. Cl.
| | | |
|---|---|---|
| *H04B 10/2575* | (2013.01) | |
| *H04N 21/61* | (2011.01) | |
| *H04L 12/28* | (2006.01) | |
| *H04B 10/54* | (2013.01) | |

(52) U.S. Cl.
CPC ....... *H04B 10/25758* (2013.01); *H04B 10/58* (2013.01); *H04L 12/2885* (2013.01); *H04N 21/6168* (2013.01); *H03M 3/458* (2013.01); *H03M 3/50* (2013.01); *H04B 10/541* (2013.01)

(58) Field of Classification Search
CPC ... H04L 12/2885; H04B 10/58; H04B 10/541; H04B 10/25758
See application file for complete search history.

(56) References Cited

U.S. PATENT DOCUMENTS

| | | | |
|---|---|---|---|
| 6,121,909 A * | 9/2000 | Lee | ........................ H03M 3/50 |
| | | | 341/143 |
| 6,172,628 B1 | 1/2001 | Sculley et al. | |
| 6,249,237 B1 | 6/2001 | Prater | |
| 6,683,905 B1 | 1/2004 | King et al. | |
| 7,123,177 B2 | 10/2006 | Cheng et al. | |
| 7,209,064 B1 | 4/2007 | Gaboriau et al. | |
| 8,907,829 B1 | 12/2014 | Naderi | |
| 9,100,041 B1 | 8/2015 | Richardson et al. | |
| 9,692,444 B1 | 6/2017 | Das et al. | |
| 10,566,994 B2 * | 2/2020 | Hamzeh | ............. H04N 21/6168 |
| 2002/0163454 A1 | 11/2002 | Yap et al. | |
| 2003/0128143 A1 | 7/2003 | Yap et al. | |
| 2004/0037363 A1 | 2/2004 | Norsworthy et al. | |
| 2004/0244049 A1 | 12/2004 | Hahin et al. | |
| 2005/0093726 A1 | 5/2005 | Hezar et al. | |
| 2005/0116850 A1 | 6/2005 | Hezar et al. | |
| 2006/0164276 A1 | 7/2006 | Luh | |
| 2008/0118003 A1 | 5/2008 | Liu et al. | |
| 2008/0163025 A1 | 7/2008 | Djordjevic et al. | |
| 2010/0328125 A1 | 12/2010 | Pagnanelli | |
| 2014/0119458 A1 | 5/2014 | Limberg | |
| 2014/0199077 A1 | 7/2014 | Ling | |
| 2014/0354353 A1 | 12/2014 | Hampel et al. | |
| 2015/0117866 A1 | 4/2015 | Chien et al. | |
| 2016/0073406 A1 | 3/2016 | Aydin et al. | |
| 2016/0127162 A1 * | 5/2016 | Doi | ..................... H04L 27/2092 |
| | | | 375/271 |
| 2016/0204873 A1 | 7/2016 | Alonso et al. | |
| 2016/0285620 A1 | 9/2016 | Ye | |
| 2016/0373133 A1 | 12/2016 | Karar et al. | |
| 2017/0126354 A1 | 5/2017 | Marsland et al. | |
| 2017/0250780 A1 | 8/2017 | Ge et al. | |
| 2017/0317686 A1 * | 11/2017 | Dartois | ..................... H03F 3/19 |

OTHER PUBLICATIONS

J. Wang et al.: "Delta-sigma Modulation for Digital Mobile Fronthaul Enabling Carrier Aggregation of 32 4G-LTE / 30 5G-FBMC Signals in a Single-λ 10-Gb/s IM-DD Channel," 2016, pp. 3, Optical Fiber Communications Conference.

* cited by examiner

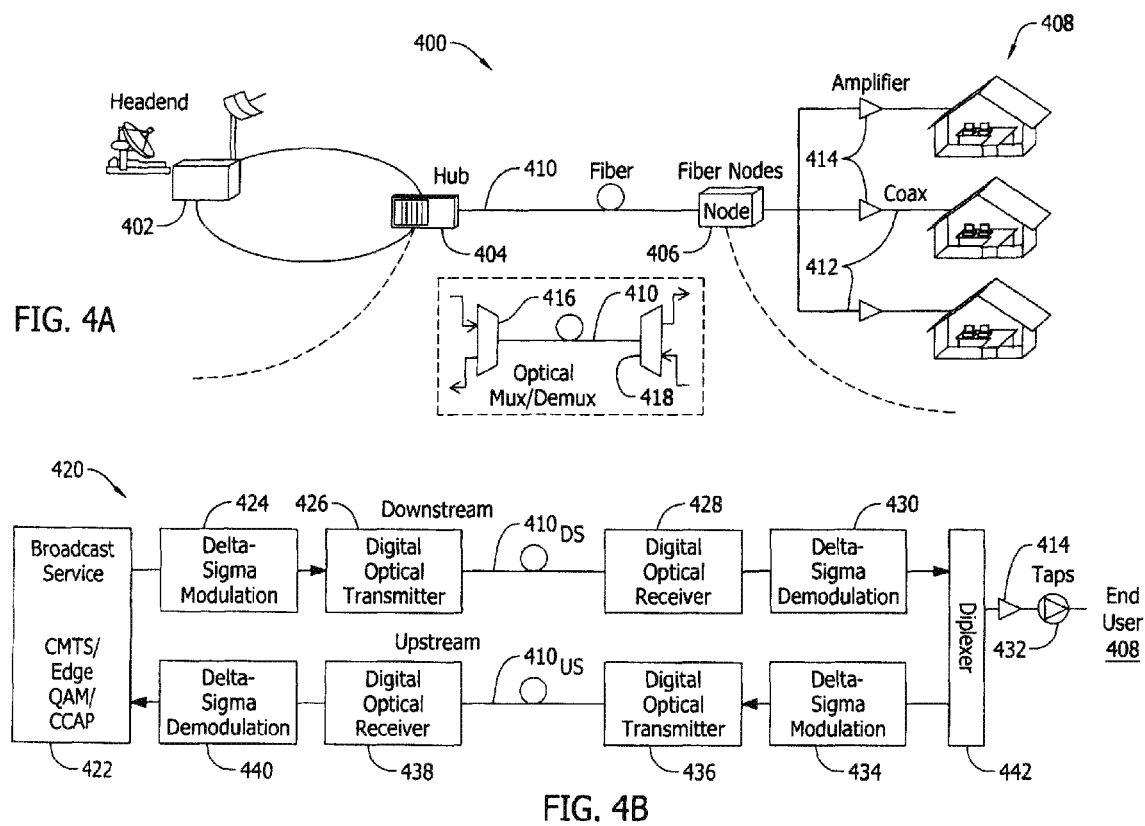

| Delta-sigma digitization | 1 | -1 | 3 | 1 | -1 | -3 | -1 | -1 | 1 | -1 | 1 | 3 | 1 |
|---|---|---|---|---|---|---|---|---|---|---|---|---|---|
| Flip | 3 | -3 | 1 | 3 | -3 | -1 | -3 | -3 | 3 | -3 | 3 | 1 | 3 |
| Scrambler A | 0 | 0 | 1 | 0 | 1 | 0 | 1 | 1 | 0 | 0 | 0 | 1 | 1 |
| Matching A | 1 | -1 | 1 | 1 | -3 | -3 | -3 | -3 | 1 | -1 | 1 | 1 | 3 |
| Scrambler B | 0 | 0 | 1 | 0 | -1 | 0 | -1 | 1 | 0 | 0 | 0 | 1 | -1 |
| Matching B | 1 | -1 | 1 | 1 | 3 | -3 | 3 | -3 | 1 | -1 | 1 | 1 | -3 |

FIG. 15

SYSTEM AND METHODS FOR VIRTUALIZING DELTA SIGMA DIGITIZATION

CROSS REFERENCE TO RELATED APPLICATIONS

This application is a continuation of U.S. patent application Ser. No. 16/180,591, filed Nov. 5, 2018, which application is a continuation-in-part of U.S. patent application Ser. No. 15/875,336, filed Jan. 19, 2018, which prior application claims the benefit of and priority to U.S. Provisional Patent Application Ser. No. 62/448,044, filed Jan. 19, 2017, and which prior application is also a continuation-in-part of U.S. patent application Ser. No. 15/847,417, filed Dec. 19, 2017, which claims the benefit of and priority to U.S. Provisional Patent Application Ser. No. 62/435,961, filed Dec. 19, 2016. This application also claims the benefit of and priority to U.S. Provisional Patent Application Ser. No. 62/581,166, filed Nov. 3, 2017. The disclosures of all of these prior applications are incorporated herein by reference in their entireties.

BACKGROUND

The field of the disclosure relates generally to fiber communication networks, and more particularly, to digitization techniques in hybrid fiber coaxial networks.

Typical hybrid fiber-coaxial (HFC) architectures deploy few long fiber strands from fiber a hub to a node, but often many short fiber strands are deployed to cover the shorter distances that are typical from legacy HFC nodes to end users. Conventional Multiple Service Operators (MSOs) offer a variety of services, including analog/digital TV, video on demand (VoD), telephony, and high speed data internet, over HFC networks that utilize both optical fibers and coaxial cables.

FIG. 1 is a schematic illustration of a conventional HFC network 100 operable to provide video, voice, and data services to subscribers. HFC network 100 includes a master headend 102, a hub 104, a fiber node 106, and end users/subscribers 108. An optical fiber 110 carries optical analog signals and connects the link between master headend 102, hub 104, and fiber node 106. A plurality of coaxial cables 112 carry radio frequency (RF) modulated analog electrical signals and connect fiber node 106 to respective end users 108.

In operation, fiber node 106 converts the optical analog signals from optical fiber 110 into the RF modulated electrical signals, which are then transported along coaxial cables 112 to end users/subscribers 108. In some instances, HFC network 100 implements a fiber deep architecture. HFC network 100 may further utilize electrical amplifiers 114 respectively disposed along coaxial cables 112 to amplify the RF analog signals to respective end users 108. In HFC network 100, both the optical and electrical signals are in the analog form from hub 104 all the way to the subscriber's home of end user 108. Typically, a cable modem termination system (CMTS) is located at either headend 102 or hub 104, and provides complementary functionality to cable modems (CMs) (not shown) respectively disposed at end users 108.

Recently, the Data Over Cable Service Interface Specification (DOCSIS) has been established as an international standard interface that permits the addition of high-bandwidth Internet protocol (IP) data transfer to an existing HFC network, such as HFC network 100. The latest DOCSIS standard, DOCSIS 3.1, offers (1) the opportunity to expand transmitted spectrum beyond the bandwidths that had previously been available, and in both the downstream and upstream directions, and (2) more efficient use of the spectrum itself. However, a DOCSIS 3.1 HFC network (i.e., supporting orthogonal frequency division multiplexing (OFDM)), when compared with its previous DOCSIS HFC network counterpart, requires significantly higher system performance for both the upstream and the downstream signals, and particularly with respect to the carrier to noise ratio (CNR) or the modulation error ratio (MER).

The DOCSIS 3.1 Physical Layer Specification defines the downstream minimum required CNR performance of OFDM signals with low-density parity-check (LDPC) error correction in additive white Gaussian noise (AWGN) channel as shown in Table 1, below. For example, a typical OFDM quadrature amplitude modulation (QAM) of 1024 (1K-QAM) requires a signal performance of 34 dB CNR, or approximately 41-41.5 decibels (dB) CNR for the 4K-QAM modulation format option in the downstream direction. A similar situation occurs in the DOCSIS 3.1 upstream transmission path, as shown in Table 2, also below.

In such analog HFC systems, the quality of the recovered RF signal channel (e.g., at CMs of end users 108) is determined according to the carrier-to-composite noise (CCN), or CCN ratio. The CCN of an HFC fiber link represents the combination of noise components (e.g., shot noise, thermal noise, laser noise (i.e., from hub/headend laser transmission), etc.), the intermodulation noise (e.g., second, third, and higher order components), and the crosstalk noise (e.g., nonlinear fiber interactions, such as four-wave mixing, cross-phase modulation, Raman crosstalk, etc.). Continuous envelope and high peak-to-average power ratio (PAPR) are significant concerns with respect to OFDM signals in particular. That is, OFDM signals are very sensitive to nonlinear intermodulation, especially composite triple beat (CTB). Second-order nonlinear products are out-of-band and are typically filtered. However, most third-order nonlinear products are located in-band, and cause problems by overlapping with existing carriers.

TABLE 1

CM minimum CNR performance in AWGN channel

| Constellation (QAM) | CNR (dB) up to 1 GHz | CNR (dB) up to 1.0-1.218 GHz |
| --- | --- | --- |
| 4096 | 41 | 41.5 |
| 2048 | 37.0 | 37.5 |
| 1024 | 34.0 | 34.0 |
| 512 | 30.5 | 30.5 |
| 256 | 27.0 | 27.0 |
| 128 | 24.0 | 24.0 |
| 64 | 21.0 | 21.0 |
| 16 | 15.0 | 15.0 |

TABLE 2

CMTS minimum CNR performance in AWGN channel

| Constellation (QAM) | CNR (dB) |
| --- | --- |
| 4096 | 43.0 |
| 2048 | 39.0 |
| 1024 | 35.5 |
| 512 | 32.5 |
| 256 | 29.0 |

TABLE 2-continued

CMTS minimum CNR performance in AWGN channel

| Constellation (QAM) | CNR (dB) |
|---|---|
| 128 | 26.0 |
| 64 | 23.0 |
| 32 | 20.0 |
| 16 | 17.0 |
| 8 | 14.0 |
| QPSK | 11.0 |

Accordingly, the link loss and the analog linear distortions significantly limit the achievable link budget of the conventional HFC network. The effect on the achievable link budget is even more pronounced with respect to high-order modulation formats, which target a high data rate. Conventional analog optics technology is unable to keep up with the increasing data demand on legacy HFC networks. Replacing such legacy HFC networks, however, would be very expensive, and thus impractical.

BRIEF SUMMARY

In an embodiment, an analog signal processor includes a sampling unit configured to (i) filter, in the frequency domain, a received time domain analog signal into a low-frequency end of a corresponding frequency spectrum, (ii) sample the filtered analog signal at a frequency substantially higher than the low-frequency end, and (iii) spread quantization noise over an expanded Nyquist zone of the corresponding frequency spectrum. The processor further includes a noise shaping unit configured to shape the spread quantization noise out of the low-frequency end of the corresponding frequency spectrum such that the filtered analog signal and the shaped quantization noise are substantially separated in the frequency domain, and a quantization unit configured to apply delta-sigma modulation to the filtered analog signal using at least one quantization bit and output a digitized bit stream that substantially follows the amplitude of the received time domain analog signal.

In an embodiment, a hybrid fiber coaxial (HFC) network is provided. The network includes an optical hub configured to transmit a digitized bit stream over a digital optical link, a fiber node configured to receive the digitized bit stream over the digital optical link and convert the received digitized bit stream into a delta-sigma demodulated analog signal, and at least one end user configured to receive the delta-sigma demodulated analog signal from the fiber node.

In an embodiment, an optical network includes a transmitter portion configured to transmit a digitized stream of symbols over a digital optical link, a mapping unit disposed within the transmitter portion and configured to code the transmitted digitized stream of symbols with a mapping code prior to transmission over the digital optical link, a receiver portion configured to recover the coded stream of symbols from the digital optical link, and a demapping unit disposed within the receiver portion and configured to map the recovered coded stream of symbols into an uncoded digitized signal corresponding to the digitized stream of symbols at the transmitter portion prior to coding by the mapping unit.

In an embodiment, a method for virtually performing delta-sigma digitization is provided. The method is performed on a series of digital samples output from a communication stack of a communication network. The method includes steps of obtaining a delta-sigma digitization sampling frequency for the output series of digital samples, calculating an oversampling ratio for the output series of digital samples, interpolating the output series of digital samples at a rate equivalent to the oversampling ratio, and quantizing the interpolated series of digital samples to plurality of discrete predetermined levels.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein:

FIGS. 4A-B are schematic illustrations of an exemplary HFC network utilizing the delta-sigma modulation process depicted in FIG. 2B, and the delta-sigma demodulation process depicted in FIG. 3.

FIG. 15 is a graphical illustration of a symbol table comparing the symbol mapping of the several processes described herein.

Figure 1:
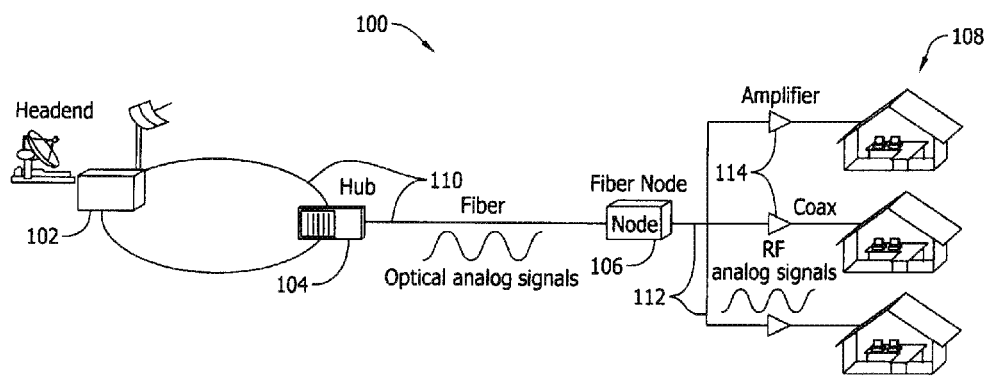
FIG. 1 is a schematic illustration of a conventional HFC network.

Unless otherwise indicated, the drawings provided herein are meant to illustrate features of embodiments of this disclosure. These features are believed to be applicable in a wide variety of systems including one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a," "an," and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise.

According to the embodiments described herein, a digital optical network implements a digital optical link over a digitized distributed network, or utilizing a digitized analog signal over the conventional HFC network. The digital optical network according to the present systems and methods is less affected by link loss, and also realizes a higher tolerance to nonlinear noise from the laser (e.g., of the headend/hub) or the fiber itself when the optical power is above the sensitivity of the receiver (e.g., of an end user). The present digital optical network is therefore advantageously able to realize transmission over longer distances, support wavelengths per fiber, and effectively eliminate optical noise contribution to CNR. Moreover, according to the advantageous techniques described herein, the CMTS and respective CMs may operate at higher orders of modulation format.

In the exemplary embodiments, optical digital transmission is accomplished utilizing delta-sigma modulation and demodulation. Key steps in the optical digital transmission process include analog-to-digital (A/D) and digital-to-analog (D/A) conversion. The A/D conversion (ADC) and D/A conversion (DAC) subprocesses involve two important factors: (1) sampling rate; and (2) bit resolution. The minimum sampling rate is generally governed according to the Nyquist Sampling Theorem, whereas the bit resolution it important for determining the quantization noise. In some of the embodiments described below, a DOCSIS digitization scheme, utilizing delta-sigma modulation and demodulation, is applied to variations of a conventional HFC network and implements one or more of (i) oversampling, (ii) decimation filtering, and (iii) quantization noise shaping, to achieve ultra-high resolution and excellent antialiasing filtering. The present embodiments are therefore of particular advantageous use in audio applications, precision temperature measurements, and weighing scales.

The present systems and methods are further capable of implementing low-pass filtering that does not demand the processing latency experienced in conventional HFC networks. Furthermore, the present optical digital transmission systems and networks realize even lower latencies than those experienced utilizing conventional ADC/DAC approaches. Low latency is a particularly critical factor in virtual reality and immersive applications that networks of the future will have to support. By leveraging frequency selective digitization, the present embodiments are even further able to advantageously reduce the amount of data required to represent the analog spectrum, such as the analog cable signal of HFC network 100, FIG. 1, above.

Figure 2A:
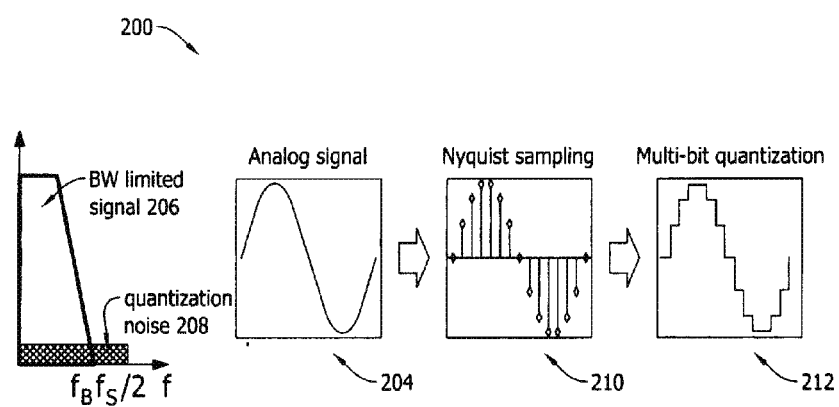
FIGS. 2A-2B are graphical illustrations depicting respective operating principles of a conventional sampling process 200 compared with an exemplary modulation process.
Figure 2B:
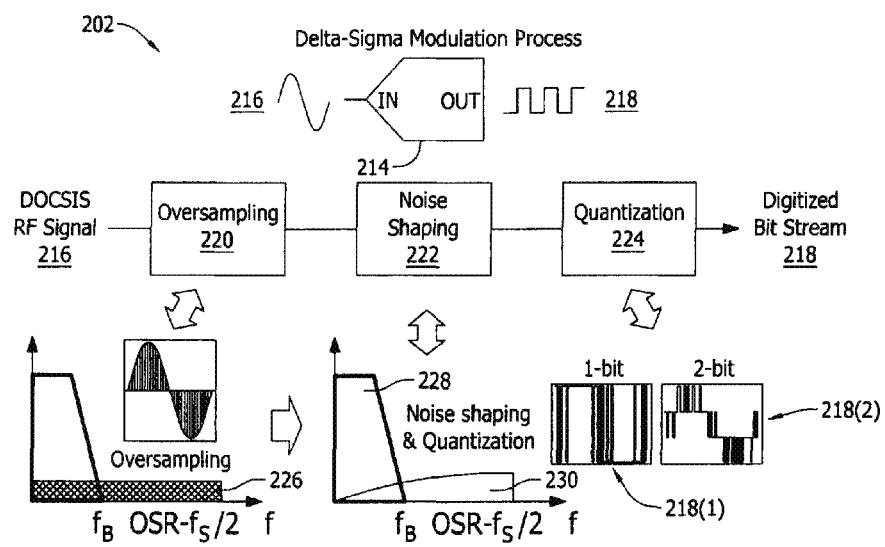

FIGS. 2A-2B are graphical illustrations depicting respective operating principles of a conventional sampling process 200 compared with an exemplary modulation process 202, according to an embodiment. Process 200 depicts the operation of a conventional Nyquist-Shannon sampling ADC for an analog signal 204 (shown the time domain). In the exemplary embodiment, process 200 bandwidth-limits analog signal 204 in the corresponding frequency domain (e.g., using a low-pass filter 206, at frequency $f_B$). In the example shown in FIG. 2A, quantization noise 208 is uncorrelated with the frequency of the input signal, and is spread evenly over the Nyquist bandwidth $f_S/2$. Process 200 performs Nyquist sampling 210 of analog signal 204 (i.e., at the Nyquist frequency), and quantizes each sample by multiple quantization bits to produce multi-bit quantization signal 212.

Since the quantization noise of a Nyquist ADC is approximately Gaussian, as well as uniformly spread over the Nyquist zone, a very large number of quantization bits are needed to ensure the signal-to-noise ratio (SNR) (e.g., CNR or MER) of the resulting digitized signals 212. Such a large number of required quantization bits leads to very high requirements for the effective number of bits (ENOB), while also producing a low spectral efficiency and a data rate bottleneck. That is, according to the prior art techniques, a narrow band analog signal can consume tremendous transmission bandwidth after digitization, due to the large number of quantization bits for each sample.

These drawbacks of conventional sampling techniques are solved according to exemplary modulation process 202. As depicted in FIG. 2B, in exemplary modulation process 202, a processor 214 of an A/D converter (not shown in FIG. 2B) applies delta-sigma modulation to exploit an oversampling ADC that utilizes one or two quantization bits on an input signal 216 to generate an output signal 218. In some embodiments, output signal 218 is binary (e.g., one-bit quantization). In other embodiments, output signal 218 is a PAM4 output signal (e.g., two-bit quantization).

More particularly, modulation process 202 implements an oversampling subprocess 220, a noise shaping subprocess 222, and a quantization subprocess 224. In oversampling subprocess 220, modulation process 202 samples analog input signal 216 (e.g., a DOCSIS RF signal) at a high frequency, and spreads the quantization noise over an expanded Nyquist zone 226. Modulation process 202 then implements noise shaping subprocess 222 to push the quantization noise out of the signal band. In the example depicted in FIG. 2B, a low-pass delta-sigma modulator 228 places analog signal 216 in the low-frequency end of the spectrum, and a noise transfer function 230 functions as a high-pass filter to push the quantization noise out of the signal band to the high frequency end, such that analog signal 216 is separated from the noise in the frequency domain. The delta-sigma modulation technique of modulation process 202 outputs binary (e.g., on/off key (OOK)) signal 218(1) or non-binary signal 218(2) (e.g., PAM4 (pulse-amplitude-modulation having four amplitude levels)), depending on one-bit or two-bit quantization, and having a baud rate equal to the oversampling ADC of the subprocess 220. Accordingly, the resulting output binary or non-binary signal 218 generally follows the amplitude of analog input signal 216 in an average sense.

According to the advantageous technique of modulation process 202, the output produced using the present delta-sigma modulation techniques represents a high data rate bit stream (e.g., output 218), having an amplitude that generally tracks with the amplitude of the input analog signal (e.g., input signal 216) after a weighted moving average, for example. In the exemplary embodiment, an averaging process implements low-pass filtering, and is thereby capable of smoothing out the high frequency oscillation of the output digitized bit stream. The use of low-pass filtering further advantageously allows for easier and more reliable retrieval, i.e., modulation, of the original analog signal from the output digitized bit stream, as described below with respect to FIG. 3.

Figure 3:
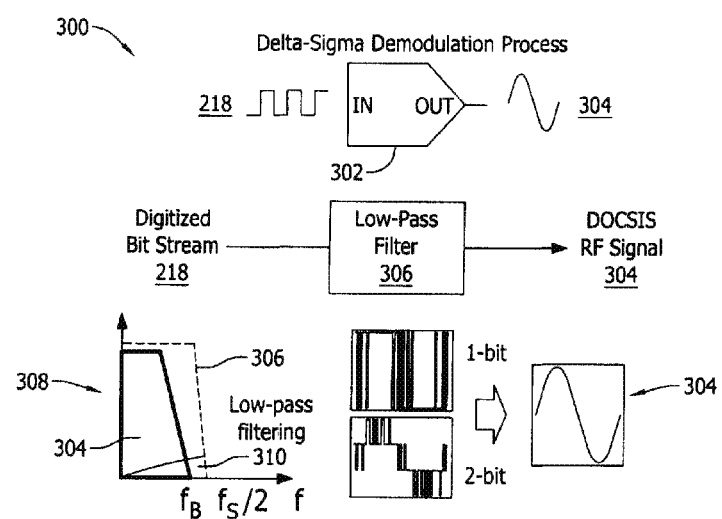
FIG. 3 is a graphical illustration depicting an operating principle of a demodulation process for the modulated digitized output signal depicted in FIG. 2B, according to an embodiment.

FIG. 3 is a graphical illustration depicting an operating principle of a demodulation process 300 for the modulated digitized output signal 218, FIG. 2B, above. More specifically, in demodulation process 300, a processor 302 implements delta-sigma demodulation to retrieve an analog signal 304 from digitized bit stream 218, FIG. 2B, using a low-pass filter 306. This advantageous technique is significantly simpler in comparison to the conventional Nyquist DAC, which reads the quantization bits of each sample, and converts the read quantization bits to an appropriate output level. A frequency domain diagram 308 illustrates the advantages of the present delta-sigma operating principle, in the frequency domain, over the more laborious conventional Nyquist demodulation techniques. That is, low-pass filter 306 effectively eliminates the out-of-band noise and filters retrieved analog signal 304 at the low frequency end. In this example, as illustrated in FIG. 3, retrieved analog signal 304 has an uneven noise floor 310 due to noise shaping.

FIGS. 4A-B are schematic illustrations of an exemplary digitized HFC network 400 utilizing modulation process 202, FIG. 2B, and demodulation process 300, FIG. 3. Digitized HFC network 400 is similar to HFC network 100 in overall structure, except that digitized HFC network 400 is configured to implement delta-sigma modulation and demodulation instead of the conventional A/D and D/A conversion techniques. Specifically, HFC network 400 includes a headend 402, a hub 404, a fiber node 406, end users/subscribers 408, and at least one optical fiber 410 connecting the link between headend 402, hub 404, and fiber node 406. Optical fiber 410 is also configured to carry digitized bit streams of the downstream and/or upstream optical signals. A plurality of coaxial cables 412 connect fiber node 406 to respective end users 408, and carry the analog electrical signals therebetween. Digitized HFC network 400 optionally implements amplifiers 414 along coaxial cables 412.

In some embodiments, both of the digitized upstream and downstream optical signals are transmitted along the same optical fiber 410. In such instances, hub 404 includes an optical multiplexer/demultiplexer 416 for respectively combining/splitting the downstream and upstream optical signals, and fiber node 406 similarly includes an optical multiplexer/demultiplexer 418. Multiplexers/demultiplexers 416, 418 may be passive devices, such as diplexers, or active configuration units. In other embodiments, the upstream and downstream signals are transmitted along separate fibers, and multiplexing is optional (e.g., where multiple optical signals are transmitted in the same direction).

FIG. 4B illustrates an exemplary architecture 420 for implementing the delta-sigma modulation and demodulation processes of digitized HFC network 400. In operation of architecture 420, a downstream analog signal (e.g., analog signal 216, FIG. 2B) from a CMTS 422 of headend 402/hub 404 is converted into a digital signal by a downstream delta-sigma modulator 424 (e.g., using modulation process 202, FIG. 2B) for analog signal digitization. In the exemplary embodiment, the downstream analog signal is an analog DOCSIS RF signal from a broadcast service of CMTS 422, or may constitute edge QAM technology or a converged cable access platform (CCAP). A bit stream (e.g., output 218, FIG. 2B) generated by downstream modulator 424 drives a downstream digital optical transmitter 426 to transmit the downstream digitized bit stream over optical fiber 410 to be received by a downstream digital optical receiver 428 of fiber node 406.

At fiber node 406, a downstream delta-sigma demodulator 430 converts (e.g., by demodulation process 300, FIG. 3) the downstream electrical digital bit stream from downstream demodulator 430 back into analog form, where this demodulated downstream analog signal may be further transmitted throughout an existing HFC cable infrastructure, such as over coaxial cables 412, amplifiers 414, and optional taps 432.

In further operation of digitized HFC network 400, upstream transmissions are accomplished similarly to the downstream transmissions, but in reverse. That is, fiber node 406 receives an analog RF signal from one or more end users 408. An upstream delta-sigma modulator 434 converts the upstream analog signal into a digital upstream bit stream, which drives an upstream digital optical transmitter 436 of fiber node 406 to transmit the upstream digitized bit stream over optical fiber 410, to be received by an upstream digital optical receiver 438 of hub 404. An upstream delta-sigma demodulator 440 converts the upstream electrical digital bit stream into analog form, which may then be received by CMTS 422.

As described above, for upstream transmissions, a different optical wavelength from the downstream transmission may be used. Alternatively, the downstream and upstream digitized bit streams may be separately transmitted over separate optical fibers $410_{DS}$ and $410_{US}$, respectively. In the alternative embodiments, an electrical diplexer 442 and/or optical multiplexers/demultiplexers (e.g., elements 416, 418, FIG. 4A) may be utilized where node aggregation and/or node splitting is desired. The present embodiments are therefore of particular advantage to fiber-starved network environments faced by many present-day cable operators, where more limited conventional node aggregation and splitting techniques are commonly implemented to maximize fiber utilization.

By rendering the delta-sigma modulation and demodulation processes complementary (or the same) in both the downstream and upstream directions, the present techniques may be further advantageously deployed within existing legacy HFC networks, and without requiring significant hardware modifications to the CMTS in the headend/hub, or to the existing infrastructure between the fiber node and end users (i.e., electrical amplifiers, taps, etc.). In the exemplary embodiment illustrated in FIGS. 4A-4B, the optical connection between the hub and the fiber node is upgraded to a digital optical link. Through this digital optical link, digitized HFC network 400 is therefore advantageously capable of utilizing several different optical transport technologies, such as direct optical detection or coherent optical detection, depending on the requirement of oversampling rate and SNR for the various transmission conditions (e.g., legacy fiber, distance, etc.) and resulting link capacity. Through these advantageous techniques, the present systems and methods are thus able to achieve significantly longer transmission distances through use of the high-performance, delta-sigma modulation-based digital transmission.

At present, transport in the cable environment is asymmetric. Accordingly, the requirements for HFC systems that implement the present delta-sigma modulation techniques may also be applied asymmetrically. According to the delta-sigma modulation techniques described herein though, only the transmitter side experiences increased complexity to the oversampling subprocesses. In contrast, no such complexity is required on the receiver side. That is, implementation costs at the receiver side will be minimal. However, the asymmetry of conventional HFC networks nevertheless allows implementation costs on the transmitter side to be significantly reduced as well. For example, some DOCSIS 3.1 implementations utilize a high-split scenario, such as 1.2 GHz downstream/200 MHz upstream. Accordingly, the costs of transmitting upstream will still be reduced in comparison with costs of transmitting downstream, since the upstream bandwidth is a fraction of the downstream bandwidth. Furthermore, since many end users do not fully utilize the available upstream transport, the sampling needs from a customer perspective might be even lower in practice, and therefore the resulting transmitter implementation costs on the customer side as well.

Additionally, the digital optical link of the upgraded node, according to the embodiments illustrated in FIGS. 4A-B, achieve significantly improved reliability as compared to conventional techniques that are intended to support higher DOCSIS performance levels. That is, the delta-sigma modulation/demodulation techniques of the present embodiments will have superior reliability over conventional remote-CMTS, remote-PHY, and A/D-D/A digitization approaches. The delta-sigma modulation and demodulation processes described herein therefore have particular applicability to support heterogeneous service environments that include wireless backhaul and business connections according to end user requirements, while greatly simplifying the operational complexity for all end users.

Figure 5A:
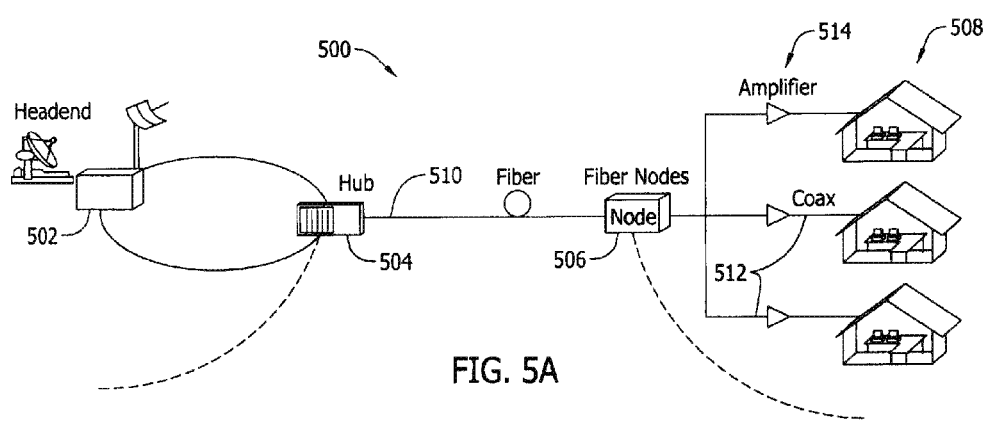
FIGS. 5A-B are schematic illustrations of an exemplary digitized distributed network utilizing the delta-sigma modulation process depicted in FIG. 2B, and the delta-sigma demodulation process depicted in FIG. 3.
Figure 5B:
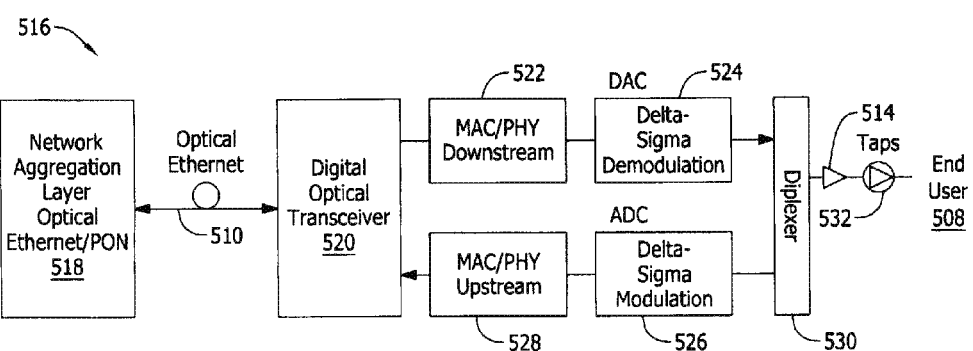

FIGS. 5A-B are schematic illustrations of an exemplary digitized distributed network 500 utilizing modulation process 202, FIG. 2B, and demodulation process 300, FIG. 3. As shown in FIG. 5A, distributed network 500 is structurally similar to digitized HFC network 400, and includes a headend 502, a hub 504, a fiber node 506, end users/subscribers 508, at least one optical fiber 510, a plurality of coaxial cables 512, and optional amplifiers 514. Distributed network 500 differs though, from digitized HFC network 400 in operation, as explained further below with respect to FIG. 5B.

FIG. 5B illustrates an exemplary distributed architecture 516 for implementing the delta-sigma modulation and demodulation processes of distributed network 500. Operation of distributed architecture 516 differs from the operation of architecture 420, FIG. 4, in that distributed architecture 516 distributes the PHY layer into the HFC network. That is, distributed architecture 516 distributes the PHY layer to fiber node 506 (or the PHY shelf), thereby effectively removing the PHY from a CMTS 518 (i.e., the CCAP Core), for example, thereby further rendering it possible to eliminate the need for an analog laser (not shown) in the headend 502/hub 504. In this embodiment, CMTS 518 is thus functionally converted to digital fiber Ethernet link (e.g., a network aggregation layer for an optical Ethernet or passive optical network (PON)), and optical fiber 510 functionally serves as an optical Ethernet digital fiber.

At fiber node 506, a digital optical transceiver 520 receives the digital signals from CMTS 518, at a downstream distributed MAC/PHY layer 522 for conversion, by a downstream delta-sigma demodulator 524, to an analog signal. Similarly, an upstream delta-sigma modulator converts analog signals from end users 508 into digitize signals for an upstream distributed MAC/PHY layer 528 to provide to digital optical transceiver 520 for upstream transport over fiber 510. Similar to architecture 420, FIG. 4, distributed architecture 516 may further include a diplexer 530 and at least one tap 532. In this example, distributed architecture 516 advantageously utilizes downstream delta-sigma demodulator 524 as a D/A converter, and upstream delta-sigma modulator 526 as an A/D converter. Therefore, the delta-sigma modulation and demodulation techniques of FIGS. 5A-B may be fully implemented in both the upstream and downstream directions, respectively.

According to this embodiment, a low-cost demodulation process is provided. The implementation thereof achieves an ultra-high resolution for RF signal conversion, and is capable of utilizing either direct or coherent detection technologies using the optical connection between the headend/hub and fiber node. Through the economic simplification of distributed architecture 516, distributed network 500 requires only one delta-sigma modulator/demodulator pair at fiber node 506 for RF-to-digital conversion.

Figure 6A:
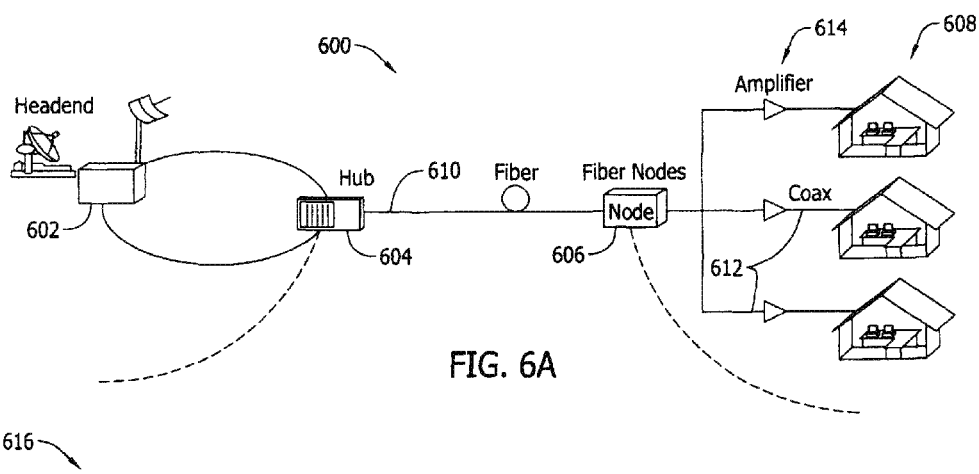
FIGS. 6A-B are schematic illustrations of an exemplary radio frequency over glass network utilizing the delta-sigma modulation process depicted in FIG. 2B, and the delta-sigma demodulation process depicted in FIG. 3.
Figure 6B:
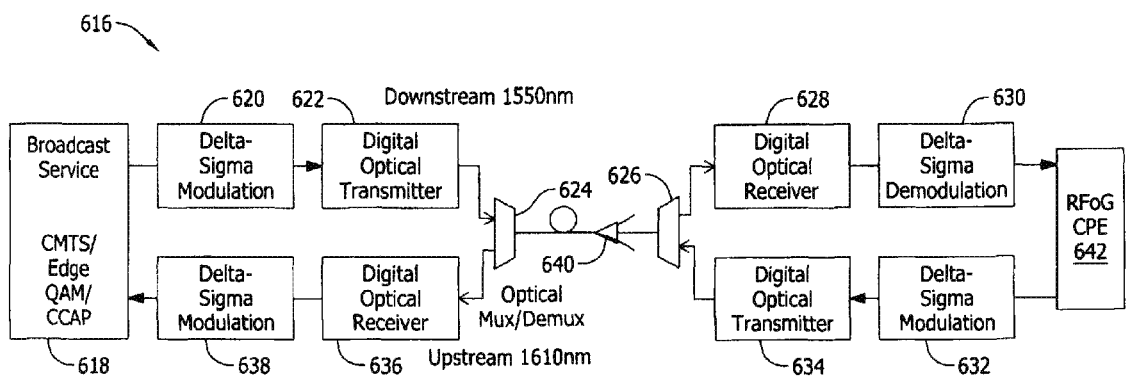

FIGS. 6A-B are schematic illustrations of an exemplary radio frequency over glass (RFoG) network 600 utilizing modulation process 202, FIG. 2B, and demodulation process 300, FIG. 3. As shown in FIG. 6A, RFoG network 600 is structurally similar to digitized HFC network 400, and includes a headend 602, a hub 604, a fiber node 606, end users/subscribers 608, at least one optical fiber 610, a plurality of coaxial cables 612, and optional amplifiers 614. RFoG network 600 differs though, from digitized HFC network 400, in that RFoG analog optics technology transmits RF over fiber, instead of coaxial cable, to a terminating unit (e.g., an optical network unit (ONU) or an optical network terminal (ONT), not individually shown) deployed at the respective customer premises of end users 608.

FIG. 6B illustrates an exemplary RFoG architecture 616 for implementing the delta-sigma modulation and demodulation processes of RFoG network 600. RFoG architecture 616 is similar to architecture 420, FIG. 4, and includes a CMTS 618, a downstream delta-sigma modulator 620, a downstream digital optical transmitter 622, a hub diplexer 624 (or multiplexer/demultiplexer), a fiber node diplexer 626 (or multiplexer/demultiplexer), a downstream digital optical receiver 628, a downstream delta-sigma demodulator 630, an upstream delta-sigma modulator 632, an upstream digital optical transmitter 634, an upstream digital optical receiver 636 of hub 604, and an upstream delta-sigma demodulator 638. In the exemplary embodiment, RFoG architecture 616 further includes at least one optical splitter 640 disposed along optical fiber 610. Downstream delta-sigma demodulator 630 and upstream delta-sigma modulator 632 communicate with a customer premises equipment (CPE) 642 of at least one end user 608.

According to the advantageous embodiments illustrated in FIGS. 6A-B, a significant improvement to the transmission performance of the digital link of RFoG network 600 is achieved by introducing delta-sigma modulation and demodulation processes at both the headend/hub and the customer premises/end users, thereby effectively replacing optical connection with digital transmissions. The architecture and operation of RFoG network 600 is particularly advantageous to customer users having existing home coaxial wiring and/or CPEs; implementation of RFoG network 600 requires no hardware changes to such existing infrastructure. Furthermore, the digital fiber deep architecture of RFoG network 600 further allows the delivered data rate to be increased to end users 608. Where splitter 640 is implemented, the splitting ratio may also be further increased due to the higher power budget margin achievable from such digital transmission links.

According to the advantageous systems and methods described above, efficient digitization techniques may be employed over conventional HFC in RFoG networks to significantly expand transport capabilities of existing fiber strands, and without requiring significant hardware modification or costs. The systems and methods described herein utilize existing fiber infrastructures to increase the capacity of such existing infrastructures, but without increasing complexity at the receiver side. The present embodiments also advantageously utilize existing network transmission asymmetry to further reduce complexity at the transmitter side. The present systems and methods thus significantly extend the life of existing fiber infrastructures, and also more efficiently use existing optical wavelengths. Through the techniques described herein, a fiber communication network will realize increased scalability, thereby allowing the network to flexibly grow according to increasing demand from cable subscribers.

Exemplary embodiments of analog digitization systems and methods are described above in detail. The systems and methods of this disclosure though, are not limited to only the specific embodiments described herein, but rather, the components and/or steps of their implementation may be utilized independently and separately from other components and/or steps described herein. Additionally, the exemplary embodiments can be implemented and utilized in connection with other access networks utilizing fiber and coaxial transmission.

Mapping and DeMapping Digitized Signals for Optical Transmission

Digitization of analog signals can significantly improve the achievable SNR/CNR and capacity over digital optical transmission links. As described above, delta-sigma ADC improves over the conventional Nyquist ADC, by featuring high oversampling rate and a small number of quantization bits (1-2 bits). As described above, the conventional Nyquist ADC operates at the Nyquist sampling rate and exploits many quantization bits to suppress the quantization noise, whereas delta-sigma ADC may use only 1 or 2 quantization bits, and rely on the oversampling technique to expand the Nyquist zone. The delta-sigma ADC further exploits noise shaping techniques to move quantization noise out of the signal band and enhance in-band SNR, so that the effective quantization bit number is increased.

The embodiments herein and below are described herein particularly with respect to DOCSIS signals (and DOCSIS 3.1), but the present embodiments also provide significant advantages with respect to other multicarrier signals, such as Wi-Fi, WiMAX, UWB, LTE, and 5G wireless signals. The digitization processes of the present embodiments are still further applicable to analog signals for fronthaul and/or backhaul applications.

The following embodiments represent systems and methods for symbol mapping of digitized signals at the transmitter side, after delta-sigma digitization (DSD), and the symbol demapping of recovered signals at the receiver side. The remapping processes map the recovered signals to the original digitized signal sequences. The innovative techniques described herein increase system performance, while also reducing costs for deeper nodes and higher bandwidths for customer applications, while leveraging existing optical components and fiber infrastructure.

In an exemplary embodiment, for OOK signals generated by 1-bit DSD, a symbol mapping process scrambles the bit sequence to avoid consecutive 0s or 1s, such that the digitized signal not only has equal amount of 0 bits and 1 bits, but also has 0 s and 1s evenly distributed in the time sequence to facilitate the optical transmission and clock recovery at digital receiver. For PAM4 signals, on the other hand, generated by 2-bit DSD, a symbol mapping process modifies the distribution of $\pm 1$ and $\pm 3$ symbols, so that the digitized symbols are equally distributed on $\pm 1$s and $\pm 3$ s for optical transmission link, as described further below.

Analog signal utilization is prevalent in HFC networks of the cable television industry. Utilization of analog signals though, is being challenged by the appearance of DOCSIS 3.1. In analog systems, e.g., DOCSIS 3.0 and earlier HFC networks, the quality of received RF signals is determined by the composite carrier to noise ratio (CCNR), which is limited by a combination of noise and nonlinear impairments contributed by both electrical and optical domains.

By transforming the signal waveforms from single-carrier to multicarrier OFDM, DOCSIS 3.1 supports higher order modulation formats for improved spectral efficiency, increased data capacity, and more flexible spectral resource allocation. However, OFDM signals feature continuous envelopes and high peak-to-average power ratio (PAPR), which make the OFDM signals vulnerable to transmission impairments and nonlinear distortions. For example, third order distortions, such as composite triple beat (CTB), can produce in-band interference components, which would overlap with the existing OFDM subcarriers and are difficult to filter. Moreover, in order to support the challenging CNR requirements for high order modulation formats (e.g., 1024QAM and above) of DOCSIS 3.1, conventional analog fiber optic technologies have been pushed to their extremes. The achievable link budget of the conventional system is significantly limited by the nonlinear distortion of the analog signals.

According to the innovative embodiments described herein, the transmission performance of DOCSIS 3.1 signals in HFC networks is significantly improved by utilizing digital links to leverage existing digital fiber communication technologies in HFC networks, such as coherent data center interconnect (DCI), or intensity modulation-direct detection (IM-DD) PONs. Digital links are more robust against power loss and nonlinear impairments, and the received optical power is maintained above the receiver sensitivity. Through these innovative techniques, increased fiber distance, enlarged coverage of the headend/hub, and enhanced tolerance of transmission impairments are achieved. With digital error-free transportation, the transmission impairments of digital links may be essentially isolated from the quality of received RF signals. That is, the CNR degradation contributed by optical/electrical noise and distortions can be eliminated. Furthermore, by exploiting wavelength-division multiplexing (WDM) technology, the digital optical systems of the present embodiments may further support multiple wavelengths per fiber, thereby allowing for future capacity upgrade.

The embodiments described herein are different from the conventional Nyquist digitization, which features symmetric complexity of AD/DA operations on the transmitter/receiver side; the delta-sigma digitization (DSD) techniques of the present embodiments provide asymmetric complexities for AD and DA operations.

Figure 7:
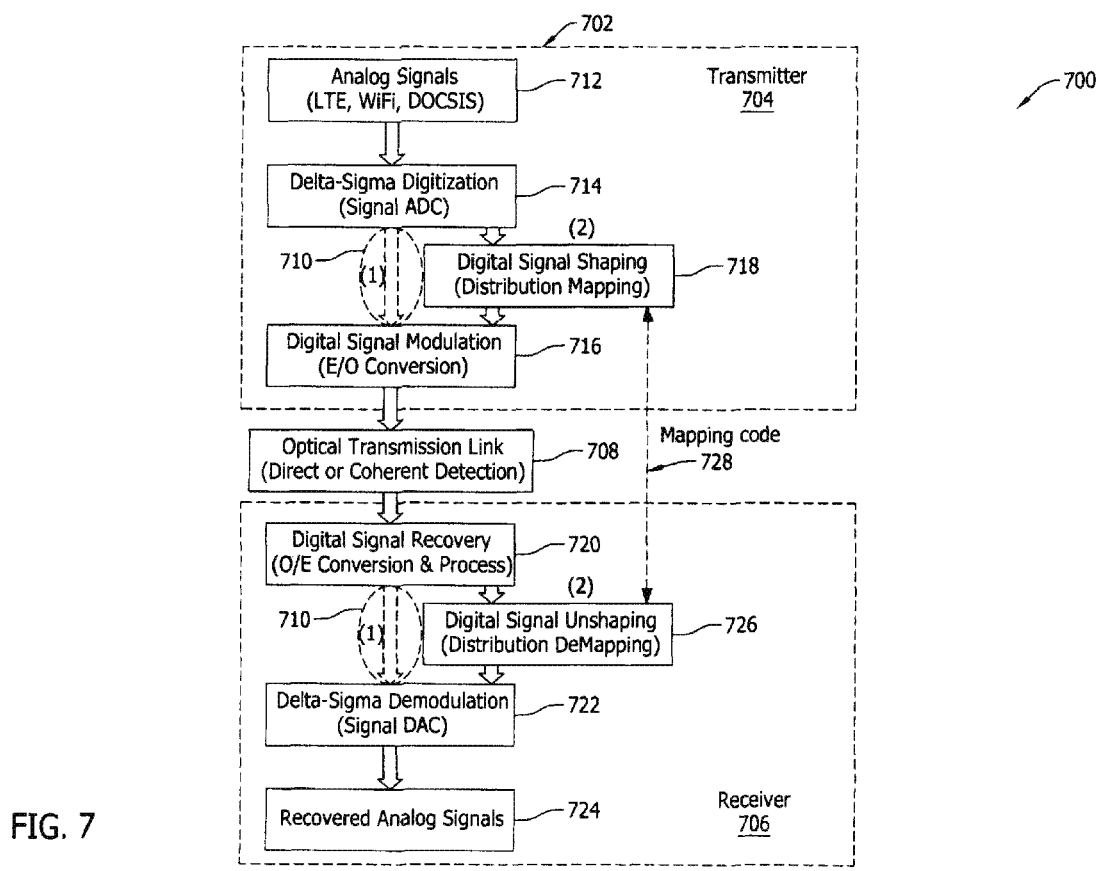
FIG. 7 is a schematic block diagram of an exemplary system-level signal mapping process, according to an embodiment.

FIG. 7 is a schematic block diagram of an exemplary system-level signal mapping process 700. In an exemplary embodiment, process 700 is implemented with respect to a coherent optical network system 702, which includes a transmitter portion 704 and a receiver portion 706, in operable communication with each other over an optical transmission link 708 (e.g., for direct or coherent detection). In the exemplary embodiment, transmitter portion 704 represents the headend and/or optical hub, and includes a complex, high speed ADC (not shown in FIG. 7), which is configured to perform the oversampling, noise shaping, and quantization (1-bit or 2-bit) processes described above to convert the analog input signals to digital outputs (OOK or PAM4, respectively).

Also in an exemplary embodiment, receiver portion 706 includes a fiber node and filters (also not shown in FIG. 7) configured to perform the DAC processes described above. As described above, process 700 differs from the conventional Nyquist ADC, which eliminates quantization noise by using many quantization bits. In contrast, process 700 may implement delta-sigma ADC to move the quantization noise out-of-band. Accordingly, a low-pass filter (LPF) or band-pass filter (BPF) may be implemented on the side of receiver portion 706 to filter out the desired signal. Simultaneously, or at approximately the same time, the digitized signal may be converted back to its analog waveform by eliminating the out-of-band quantization noise. According to this advantageous configuration, channel frequency demultiplexing and D/A conversion may both the implemented by a single device.

This asymmetry of the AD/DA operations of delta-sigma digitization may be further advantageously implemented in point-to-multipoint architectures, such as PONs, mobile fronthaul networks, and HFC networks. In an exemplary embodiment, the complex ADC of process 700 may be centralized in the headend/hub, and shared by multiple fiber nodes. In contrast, the simplified LPF/BPF may be distributed in each fiber node of optical link 708 to function as both the DAC and channel de-multiplexer. According to this advantageous system architecture, the cost and design complexity of fiber nodes may be significantly reduced, but while improving system reliability.

In an exemplary embodiment, process 700 is implemented with respect to a DOCSIS 3.1 transmission. DOCSIS 3.1 utilizes OFDM signals, which have a continuous envelope and Gaussian-distributed amplitudes, i.e., there are more small amplitude samples than large amplitude samples. In the exemplary embodiment, after 1-bit delta-sigma digitization, the DOCSIS 3.1 signals are digitized to OOK signals. Although if, in this example, the number of 0 bits and 1 bits will be equal, there will also occur many consecutive 0s or 1s due to the continuous envelope of input OFDM signals. To improve the transmission performance and facilitate the clock recovery of receiver portion 706, process 700 further implements symbol mapping to scramble the bit sequence and thereby avoid consecutive 0s or 1 s. Symbol matching may then be performed, and the digitized signal produced therefrom will have not only equal amount of 0 bits and 1 bits, but also have 0s and 1s therein evenly distributed in the transmitted time sequence.

Similarly, after 2-bit delta-sigma digitization, the DOCSIS 3.1 signals may be digitized to PAM4 signals using 4 symbols, i.e., ±1 and ±3. Due to the Gaussian distribution of the input analog signal (e.g., signal 216, FIG. 2), the quantity of these four symbols will also have a Gaussian distribution, i.e., there will be more ±1s than there will be ±3s. As described further below, process 700 addresses this distribution issue by adjusting the symbol distribution of the digitized signals to more evenly equalize the quantity of each symbol that is transmitted. According to these advantageous techniques, the present embodiments more fully utilize the capacity of the digital fiber link (e.g., link 708), and maintain zero modification to the commercial DSP algorithms in coherent/IM-DD digital receivers. As described above, these techniques are not limited to DOCSIS 3.1, and may be also applied to other transmitted signals, such as Wi-Fi, WiMAX, UWB, LTE, and 5G wireless signals with the support of multicarrier modulation formats.

As described further below, process 700 implements mapping and demapping flow techniques ("(2)") in addition to the system flow 710 ("(1)," dashed circles) utilizing only the delta-sigma digitization techniques described above. In the exemplary embodiment, for an input analog signal 712, transmitter 704 implements a delta-sigma digitization subprocess 714 to perform ADC on input analog signal 712. When implementing delta-sigma digitization without mapping, process 700 will proceed from delta-sigma digitization subprocess 714 to a digital signal modulation subprocess 716 (e.g., E/O conversion). However, according to the exemplary embodiment, process 700 further includes a digital signal shaping subprocess 718, performed after delta-sigma digitization in subprocess 714, but before digital signal modulation in subprocess 716, to provide a distribution mapping of the digitized signal on the transmitter side, i.e., transmitter portion 704.

In further operation, after modulation in subprocess 716, the modulated signal is transmitted over optical transmission link 708. On the receiver side, i.e., receiver portion 706, process 700 then implements a digital signal recovery subprocess 720 (e.g., O/E conversion and processing). In the case where distribution mapping has not been implemented from subprocess 718, process 700 will proceed from recovery subprocess 722 a delta-sigma demodulation subprocess 722, from which recovered analog signals 724 are obtained. However, according to the exemplary embodiment, process 700 further includes a digital signal unshaping subprocess 726, performed after digital signal recovery in subprocess 720, but before delta-sigma demodulation in subprocess 722, to provide a distribution demapping of the digitized signal on the receiver side, i.e., transmitter portion 706, prior to analog conversion.

In the exemplary embodiment, process 700 inserts a symbol mapping subprocess (i.e., subprocess 718) on the transmitter side (i.e., transmitter portion 704) after delta-sigma digitization of input analog signal 712 in subprocess 714. Similarly, process 700 employs a symbol demapping subprocess (i.e., subprocess 726) on the receiver side (i.e., receiver portion 706) to map/demap the signal back to the original signal sequences, and then feed the demapped signal into a DAC (i.e., delta-sigma demodulation subprocess 722) for digital-to-analog conversion. In the exemplary embodiment, a mapping code 728 is communicated from digital signal shaping subprocess 718 to digital signal unshaping process 726 to modify the signal distribution transmitted over optical transmission link 708. In some embodiments, mapping code 728 is transmitted over optical transmission link 708. In other embodiments, mapping code 728 is transmitted over alternative communication channels.

According to the exemplary configuration of process 700, because the signal mapping/demapping subprocesses 718/726 are performed according to their own mapping code 728, the need is eliminated to modify existing commercial digital signal recovery algorithms after delta-sigma digitization is performed, or after the signals are transmitted over optical transmission link 708. In some embodiments, the several subprocesses of process 700 are performed by one or more hardware units (e.g., ADC, DAC, modulator, demodulator, mapper, demapper) configured to perform one or more of the respective functions thereof. In other embodiments, the several subprocesses are implemented through software programming of at least one processor of transmitter portion 704 and/or receiver portion 706. In at least one embodiment, the subprocesses are performed by a combination of hardware units and software programming. In an exemplary embodiment, the DAC includes an LPF and/or a BPF.

Figure 8:
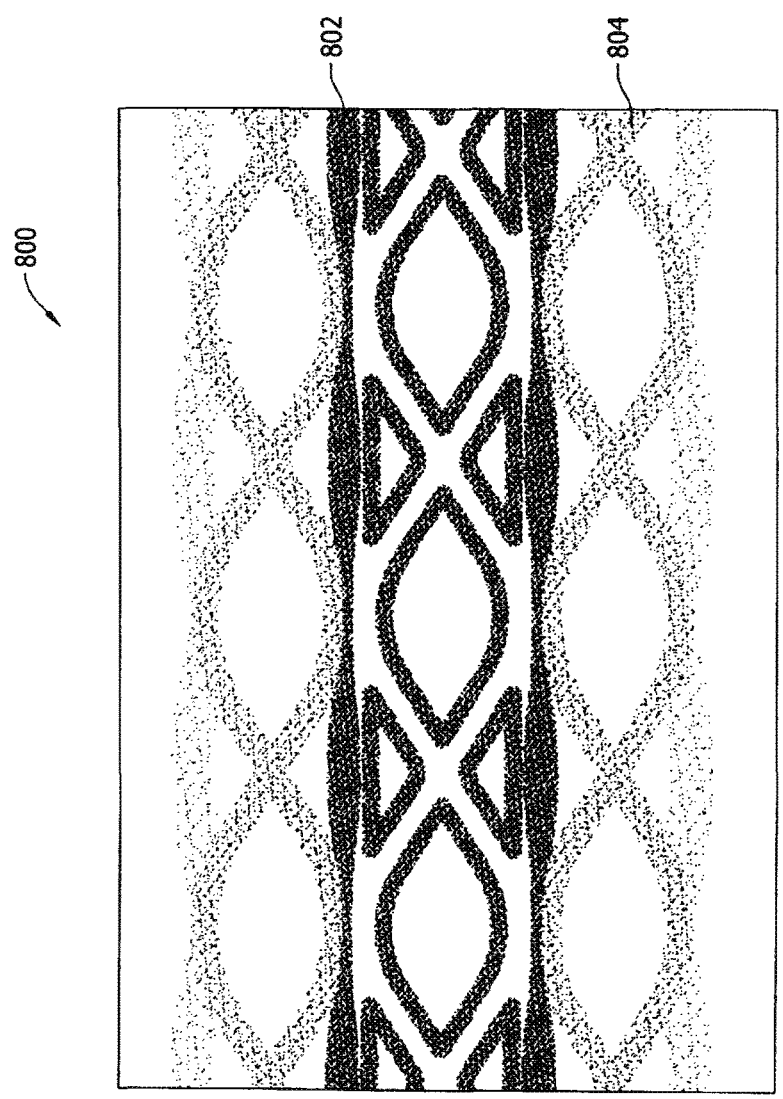
FIG. 8 is a graphical illustration depicting an unmapped electrical eye diagram of a digitized signal after delta-sigma digitization, according to an embodiment.

FIG. 8 is a graphical illustration depicting an unmapped electrical eye diagram 800 of a digitized signal after delta-sigma digitization (e.g., subprocess 714, FIG. 7). In an exemplary embodiment, eye diagram 800 represents a PAM4 signal after delta-sigma digitization. In this example, the occurrence of +1 and −1 symbols will each have probabilities of $p_1$, whereas the occurrence of +3 and −3 symbols will each have probabilities of $p_3$, and the total probabilities of all four symbols occurring will be 100%.

This total probability may be represented according to the following equation:

$$2p_1+2p_3=100\%  \quad\quad\quad (Eq.\ 1)$$

As described above, OFDM signals follow Gaussian distribution, end result in more small amplitude samples than large amplitude samples. Therefore, in the digitized PAM4 signal, there are much more ±1 symbols (small amplitude) than ±3 symbols (large amplitude), i.e. $p_1 \gg p_3$. Accordingly, as can be seen in eye diagram 800, areas 802 of greater intensity represent the ±1 symbol levels, whereas areas 804 of lesser intensity represent the ±3 symbol levels, due to the unequal distribution.

Figure 9:
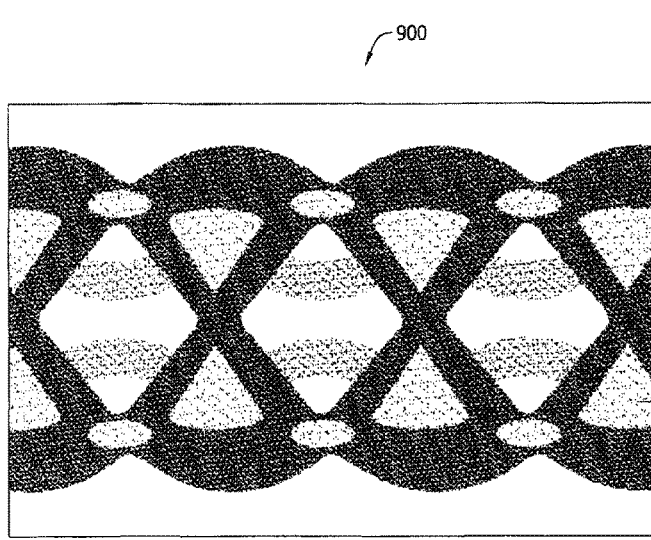
FIG. 9 is a graphical illustration depicting an electrical eye diagram of a digitized signal after delta-sigma digitization, implementing a flip mapping process.

FIG. 9 is a graphical illustration depicting an electrical eye diagram 900 of a digitized signal after delta-sigma digitization, implementing a flip mapping process. In this example, electrical eye diagram 900 represents the PAM4 signal of eye diagram 800 after delta-sigma digitization, and after implementation of a flip mapping subprocess (described further below with respect to FIG. 10).

In the exemplary embodiment, the flip mapping subprocess of eye diagram 900 maps the ±1 symbols to the ±3 symbols, but with the respective sign unchanged, and vice versa. That is, flip mapping of the symbols occurs as follows: +3→+1; +1→+3; −1→−3; −3→−1. Accordingly, since $p_1 \gg p_3$, after flip mapping, there will be significantly more ±3 symbols than ±1 symbols. Accordingly, as can be seen in eye diagram 900, areas 902 of greater intensity represent the ±3 symbol levels, whereas areas 904 of lesser intensity represent the ±1 symbol levels, in contrast to eye diagram 800.

This reversal may be represented according to the following equation:

$$y_n = \text{sgn}(x_n)(4-|x_n|) \quad\quad\quad (Eq.\ 2)$$

Where $x_n$ is the symbol value of the digitized sequence of n symbols, and $y_n$ is the symbol value of the digitized sequence after the flip mapping subprocess is implemented.

Figure 10:
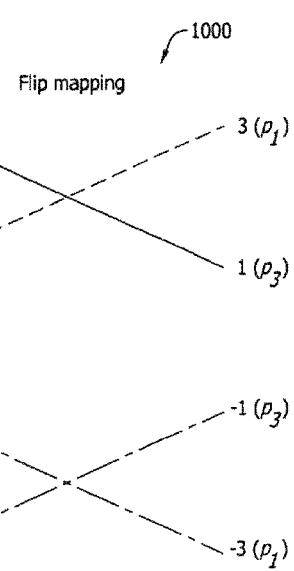
FIG. 10 is a graphical illustration of a flip mapping table that may be implemented with the digitized signal of the electrical eye diagram depicted in FIG. 9.

FIG. 10 is a graphical illustration of a flip mapping table 1000 that may be implemented with the digitized signal of electrical eye diagram 900, FIG. 9. Flip mapping table 1000 graphically illustrates the correspondence of flips of the flip mapping subprocess described above with respect to FIG. 9. In an exemplary embodiment, flip mapping table 1000 may be implemented in respective databases of the transmitter (i.e., transmitter portion 704, FIG. 7) and the receiver (i.e., receiver portion 706, FIG. 7) and communicated therebetween as a code (i.e., mapping code 728, FIG. 7).

Figure 11A:
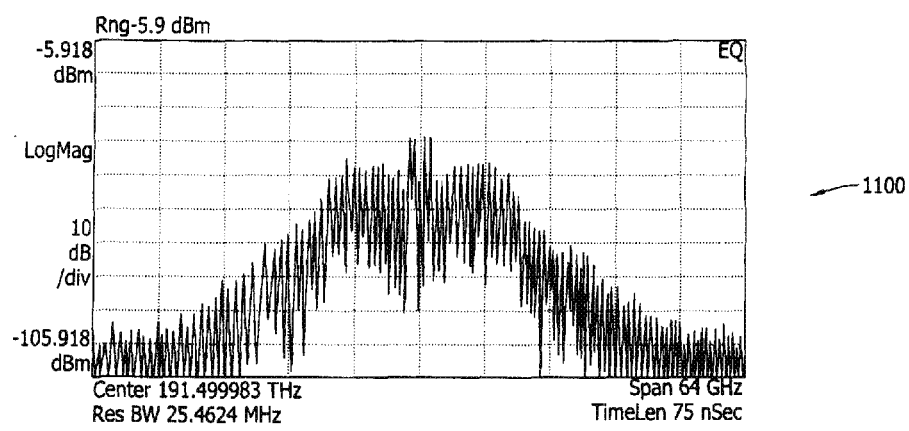
FIGS. 11A-B are graphical illustrations depicting a comparative result of a transmitted signal with and without implementation of the flip mapping processes depicted in FIGS. 9 and 10.
Figure 11B:
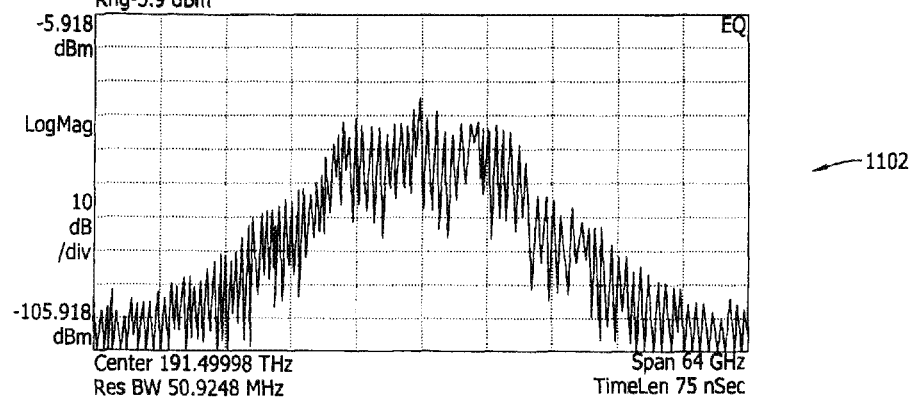

FIGS. 11A-B are graphical illustrations depicting a comparative result of a transmitted signal with and without implementation of the flip mapping processes depicted in FIGS. 9 and 10. Specifically, FIG. 11A depicts a transmitted signal 1100 upon which a delta-sigma digitization subprocess has been implemented, but not a mapping subprocess, and FIG. 11B depicts a mapped signal 1102, which represents transmitted signal 1100 after a flip mapping subprocess has been implemented thereupon. In this example, signals 1100, 1102 are illustrated as 16QAM 16GBaud signals over a 40-km transmission at 128 Gb/s. Accordingly, as can be seen from a comparison of mapped signal 1102 with the transmitted (unmapped) signal 1100, the signal magnitude smoothes significantly around the center frequency after implementation of the flip mapping subprocess.

Figure 12A:
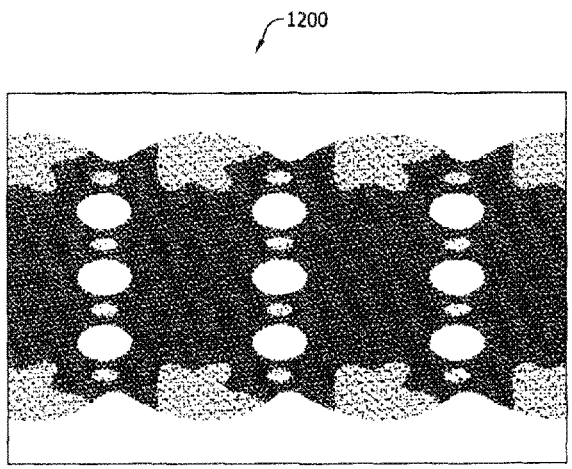
FIGS. 12A-B are graphical illustrations depicting a comparative result of an electrical eye diagram of a pseudorandom binary sequence PAM4 signal with that of a signal implementing a uniform mapping process, according to an embodiment.
Figure 12B:
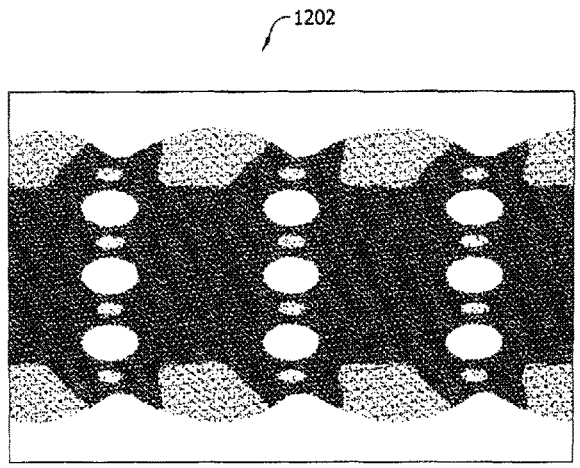

FIGS. 12A-B are graphical illustrations depicting a comparative result of a pseudorandom binary sequence (PRBS)-based PAM4 signal with a result of a signal upon which a uniform mapping subprocess (subprocess A, described below) has been implemented. Specifically, FIG. 12A depicts an electrical eye diagram 1200 of a PRBS-based PAM4 signal, and FIG. 12B depicts an electrical eye diagram 1202 of a signal implementing uniform mapping subprocess A.

In an exemplary embodiment, uniform mapping subprocess A utilizes a scrambling code $S_n$, which represents a periodic pseudo-random bit stream of 0 and 1 values with equal probabilities (i.e., 50% will be 0s, and 50% will be 1s). For an input symbol $x_n$, the value will be flipped when $S_n=1$, but remain unchanged when $S_n=0$. Thus, uniform mapping subprocess A may be implemented together with the flip mapping process described above with respect to FIGS. 9 and 10, above. Accordingly, as can be seen from a comparison of eye diagrams 1200 and 1202, after implementation of uniform mapping subprocess A, the respective ±1 and ±3 symbols are equally distributed. That is, eye diagram 1202 of the mapped signal is almost identical with eye diagram 1200 of the PRBS-based PAM4 signal.

Figure 13A:
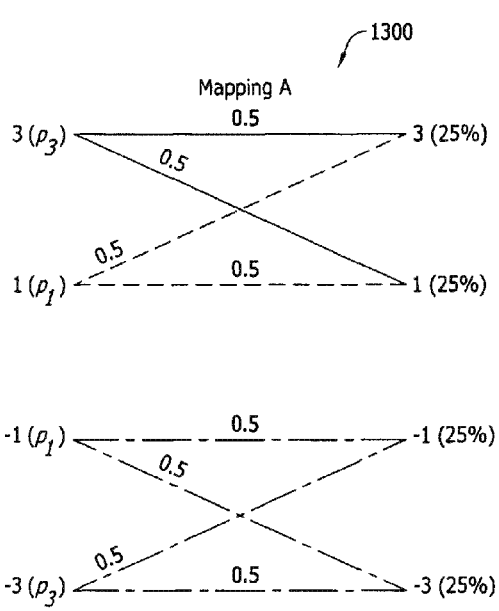
FIGS. 13A-B are graphical illustrations of alternative symbol mapping tables that may be implemented with the digitized signal of the electrical eye diagram depicted in FIG. 12B.
Figure 13B:
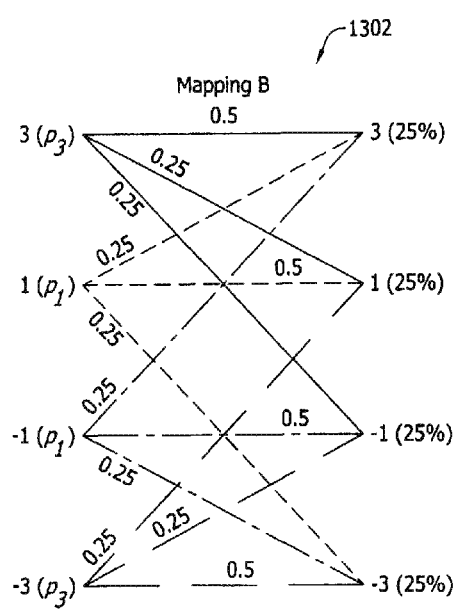

FIGS. 13A-B are graphical illustrations of alternative symbol mapping tables 1300 and 1302, respectively, that may be implemented with the digitized signal of electrical eye diagram 1202, FIG. 12B.

Symbol mapping table 1300 corresponds to uniform mapping subprocess A, described above with respect to FIGS. 12A-B. In the exemplary embodiment, utilizing scrambling code $S_n$, 50% of the +3 symbols will be mapped to a +1 symbol (e.g., $S_n=1$), whereas the other half of the +3 symbols will remain unchanged (e.g., $S_n=0$). The disposition of the +1, −1, and −3 symbols it will be determined similarly, as represented by the following equation for symbol mapping table 1300 (mapping subprocess A):

$$y_n = \begin{cases} x_n (S_n = 0) \\ \operatorname{sgn}(x_n)(4 - |x_n|)(S_n = 1) \end{cases} \quad \text{(Eq. 3)}$$

Symbol mapping table 1302 is similar to symbol mapping table 1300, but utilizes an additional value for scrambling code $S_n$. That is, according to symbol mapping table 1302 (for uniform mapping subprocess "B"), scrambling code $S_n$ represents a periodic pseudo-random bit stream of −1, 0, and 1 values with probabilities of 25%, 50% and 25%, respectively (i.e., (i.e., 25% of occurrences will be a −1, 50% of occurrences will be a 0, and 25% of occurrences will be a 1). In this alternative embodiment, for an input symbol $x_n$, the value will be flipped with its sign unchanged when $S_n=1$, and the value will be flipped with its sign also flipped when $S_n=-1$. When $S_n=0$, both the value and the sign of $x_n$ remain unchanged.

The resulting values $y_n$ may be represented according to the following equation:

$$y_n = \begin{cases} x_n (S_n = 0) \\ \operatorname{sgn}(x_n)(4 - |x_n|)(S_n = 1) \\ -\operatorname{sgn}(x_n)(4 - |x_n|)(S_n = -1) \end{cases} \quad \text{(Eq. 4)}$$

Looking specifically at the disposition of the +3 symbol, for example, 25% of the +3 symbols will be mapped to a +1 symbol, another 25% of the +3 symbols will be mapped to a −1 symbol, and the remaining 50% of the +3 symbols remain unchanged (i.e., mapped to a +3 symbol). The disposition of the +1, −1, and −3 symbols are similarly determined according to the same calculations.

Similar to the implementation of uniform mapping subprocess A, described above with respect to FIGS. 12A-B, implementation of uniform mapping subprocess B also equally distributes the ±1 and ±3 symbols after mapping, thereby producing an eye diagram (not shown) that is also almost identical to eye diagram 1200 of the PRBS-based PAM4 signal. That is, an eye diagram produced according to uniform mapping subprocess B will be identical to eye diagram 1202 produced according to uniform mapping subprocess A (and therefore also to eye diagram 1200 of the PRBS-based PAM4 signal). Accordingly, both uniform mapping subprocesses A and B may be successfully implemented to modify the symbol distribution to map the respective input signal to a PRBS signal with the statistical accuracy.

Figure 14A:
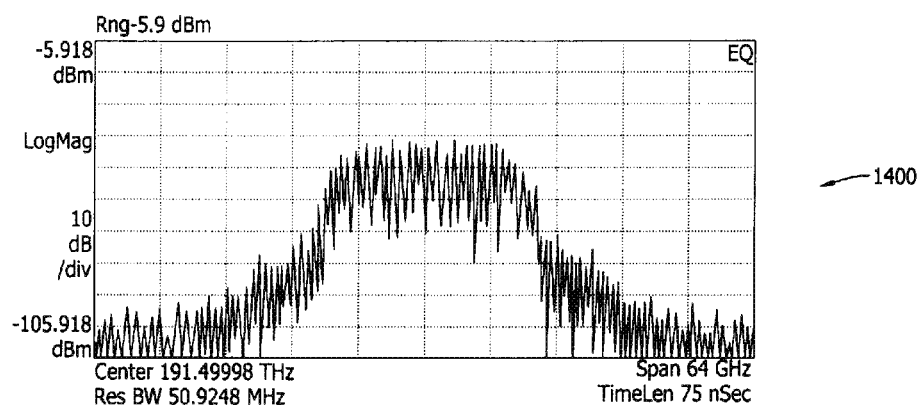
FIGS. 14A-B are graphical illustrations depicting a comparative result of a signal implementing the uniform mapping process depicted in FIG. 13A with a signal implementing the alternative uniform mapping process depicted in FIG. 13B.
Figure 14B:
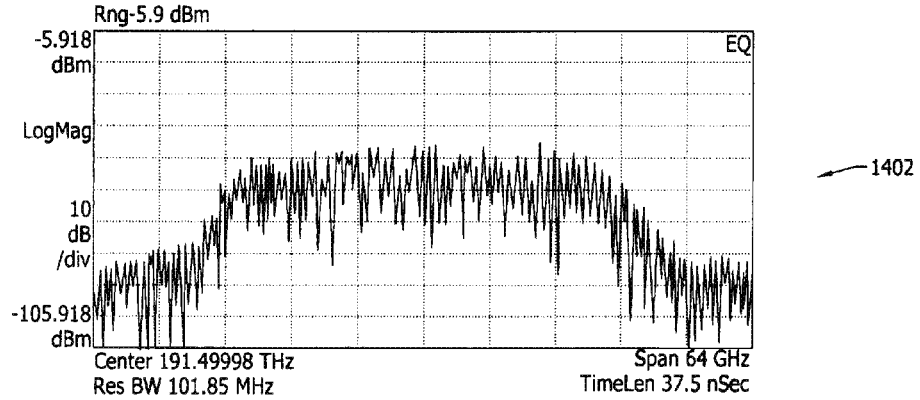

FIGS. 14A-B are graphical illustrations depicting a comparative result of a signal implementing the uniform mapping process depicted in FIG. 13A with a signal implementing the alternative uniform mapping process depicted in FIG. 13B. Specifically, FIG. 13A depicts a transmitted signal 1300 upon which uniform mapping subprocess A has been implemented, and FIG. 13B depicts a transmitted signal 1302 upon which uniform mapping subprocess B has been implemented. In this example, signal 1300 is illustrated as a 16QAM 16GBaud signal over a 40-km transmission at 128 Gb/s, and signal 1302 is illustrated as a 16QAM 32GBaud signal over a 40-km transmission at 256 Gb/s. Accordingly, as can be seen from a comparison of signals 1300 and 1302, the different uniform mapping subprocesses may be successfully implemented for similar input signals, but having different symbol rates and data rates.

FIG. 15 is a graphical illustration of a symbol table 1500 comparing the symbol mapping techniques of the several mapping subprocesses described above. In this example, the respective probabilities are labeled on each mapping pass (i.e., "Matching A" for uniform mapping subprocess A, and "Matching B" for uniform mapping subprocess B), for each respective scrambling code $S_n$ ("Scrambler A" and "Scrambler B"). As can be seen from symbol table 1500, the respective probabilities of symbol occurrences change according to whether only a delta-sigma digitization subprocess is implemented on the analog signal, or whether a flip mapping subprocess, and/or a two-value or a three-value uniform mapping/scrambling subprocess is also implemented. As described with respect to the embodiments above, the mapping and demapping techniques of the present systems and methods significantly improve the quality and capability of a digitized signal transmitted over an optical link.

Virtualized Delta Sigma Digitization

In the embodiments described above, delta sigma digitization is implemented by digitizing the RF signals at a rate much higher than traditional Nyquist rates. Where the delta-sigma digitization is implemented by hardware, the digitization may add significant complexity to the required hardware necessary to achieve the high signal rates. Accordingly, techniques for virtualizing delta-sigma digitization are desirable. The virtualized delta-sigma digitization implementations described herein advantageously realize many of the improvements described above, and at significantly reduced hardware complexities, thereby achieving substantial cost reduction and greater system efficiency.

An exemplary implementation of delta-sigma digitization is described above with respect to FIG. 2B, where the RF output (e.g., RF signal 216) from a first system (e.g., a DOCSIS system) is sampled and digitized by a delta-sigma digitization system (e.g., delta-sigma processor 214). In such hardware-implemented embodiments, the complete stack of a communication system may be implemented by software, re-programmable hardware, ASIC hardware, or a combination of any or all thereof. Nevertheless, as described above, the last phase of the system (before RF up-conversion to the desired frequency) is utilized to pass digital samples to the D/A converter (or delta-sigma demodulator) which creates the analog signal.

The following embodiments though, provide systems and methods for implementing effective delta-sigma digitization virtually, thereby resulting in significant resource savings, processing efficiencies, and performance improvements. That is, the present virtualized delta-sigma digitization systems and methods effectively intercept the original digital signal (e.g., a DOCSIS signal) prior to the digital signal being converted into an analog RF signal, and apply delta-sigma digitization to the pre-analog digitized signal, thereby eliminating the need for the D/A conversion to create an RF signal in the system. These virtualized delta-sigma digitization techniques further allow for the removal of high speed sampling hardware, as well as A/D circuitry used in hardware-based delta-sigma digitization techniques. By eliminating the need for many of these hardware components, the present embodiments also enable the advantageous reduction in the negative effects of sampling and quantization noise associated with A/D and D/A converters.

Figure 16:
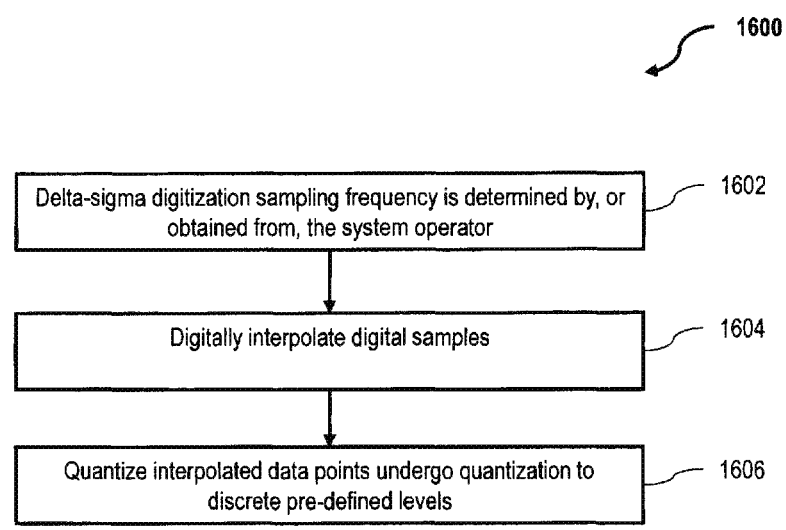
FIG. 16 is a flow diagram of a virtualized delta-sigma digitization process, according to an embodiment.

FIG. 16 is a flow diagram of a virtualized delta-sigma digitization process 1600. In an exemplary embodiment of process 1600, the digital samples created by the communication stack, which are typically sent to the D/A converter, are instead used to create the virtualized delta-sigma digitization.

Process 1600 begins at step 1602, in which the delta-sigma digitization sampling frequency is determined by, or obtained from, the system operator, and the oversampling ratio R is calculated. In step 1604, the intercepted digital samples are digitally interpolated. In an exemplary embodiment of step 1604, the digital samples are interpolated at a rate equivalent to the oversampling ratio R. Thus, given the number of K digital samples created by the communication system, the resulting samples from step 1604 will amount to a number equal to R×K. In step 1606, the R×K interpolated data points undergo quantization to discrete pre-defined levels, to create a delta-sigma digitized signal.

In an alternative embodiment, steps 1604 and 1606 may be combined as follows. Assuming, for the purposes of this example, that the oversampling ratio is R, and the delta-sigma digitization subprocess has Q=2^q quantization levels (for example, Q=2, if 2-level or binary quantization), then each two sequential digital samples may be processed at a time, that is simultaneously, with a linear interpolation being assumed between each two sequential samples. If both sequential samples fall within a single quantization level, then the output of the delta-sigma digitization subprocess for these two sequential samples will be R groups, with each of the R groups including q bits identifying the quantization level.

If, however, both sequential samples span more than a single quantization level (e.g., "k" levels), then the output of the delta-sigma digitization subprocess for the two sequential samples will still be R groups, each having q bits, but the threshold intercept points $Th_k$ thereof may be found and utilized as follows:

$$(Th_k - Y1)/(Y2 - Y1) = x_k \qquad (Eq.\ 5)$$

where Y1 represents the value of the first sample in the sequence, and Y2 represents the value of the second sample in the sequence. The duration x of the 1-N lines in each quantization zone (e.g., $x_1$, $x_2 - x_1$, $x_3 - x_2$, ..., $1 - x_N$, etc.) may be determined. That is, the signal will have $x_1 * 100\%$ in the first quantization zone, $(x_2 - x_1) * 100\%$ in the second quantization zone, etc. The delta-sigma digitization sequence may then be based on these percentages.

For example, assuming: (i) that R=10; (ii) 00, 01, 10, 11 are the quantization levels; (iii) $x_1$=0.1, $x_2 - x_1$=0.3, $x_3 - x_2$=0.4, $1 - x_3$=0.2. Accordingly, the signal is: (i) 10% in level 00→10%×R=1 00; (ii) 30% in level 01→30%×R=3 01 01 01; (iii) 40% in level 10→40%×R=4 10 10 10 10; (iv) 20% in level 11→20%×R=2 11 11. The final signal, which is delta-sigma digitized between those two samples is: 00 01 01 01 10 10 10 10 11 11.

According to process 1600, as well as its several variations, the high speed A/D and D/A converters and digitizers are no longer needed for digitization purposes; the system may alternatively be completely virtualized by software, and the receiver may then be a simple LPF as shown in the embodiments described above.

Although specific features of various embodiments of the disclosure may be shown in some drawings and not in others, this is for convenience only. In accordance with the principles of the disclosure, a particular feature shown in a drawing may be referenced and/or claimed in combination with features of the other drawings.

Some embodiments involve the use of one or more electronic or computing devices. Such devices typically include a processor or controller, such as a general purpose central processing unit (CPU), a graphics processing unit (GPU), a microcontroller, a reduced instruction set computer (RISC) processor, an application specific integrated circuit (ASIC), a programmable logic circuit (PLC), a field programmable gate array (FPGA), a DSP device, and/or any other circuit or processor capable of executing the functions described herein. The processes described herein may be encoded as executable instructions embodied in a computer readable medium, including, without limitation, a storage device and/or a memory device. Such instructions, when executed by a processor, cause the processor to perform at least a portion of the methods described herein. The above examples are exemplary only, and thus are not intended to limit in any way the definition and/or meaning of the term "processor."

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method for virtually delta-sigma digitizing a series of digital samples output from a communication stack of a communication network and mapping quantized symbols, the method comprising:

obtaining a delta-sigma digitization sampling frequency for the series of digital samples, wherein the series of digital samples includes K digital samples from the communication stack, where K is an integer greater than 1, calculating an oversampling ratio, R, for the series of digital samples;

interpolating the series of digital samples at a rate equivalent to the oversampling ratio, wherein a number of samples resulting from the step of interpolating is equal to R*K;

quantizing the interpolated series of digital samples to a plurality of discrete predetermined levels to generate a series of quantized symbols;

mapping, for at least one occurrence of a first symbol of the series of quantized symbols, the first symbol to a second symbol of the series of quantized symbols, wherein the first symbol has a first symbol amplitude value and the second symbol has a second symbol amplitude value greater than the first symbol amplitude value; and mapping, for at least one occurrence of the second symbol, the second symbol to the first symbol.

2. The method of claim 1, wherein the step of interpolating and the step of quantizing are performed together as a single operation.

3. The method of claim 1, wherein at least two sequential samples of the series of digital samples are processed at a same time.

4. The method of claim 1, further comprising a step of transmitting the quantized and mapped digital samples in digital form to a receiver.

5. The method of claim 1, wherein the series of quantized symbols has a Gaussian distribution of symbol amplitude values.

6. The method of claim 1, wherein the sign of the first and second symbols remains unchanged after mapping to the other of a first and a second symbol.

7. The method of claim 1, further comprising a step of applying a scrambling code to each input occurrence of the first and second symbols.

8. The method of claim 7, wherein the scrambling code comprises a periodic pseudo-random bit stream of 0 and 1 values having substantially equal probabilities of occurrence.

9. The method of claim 8, wherein, for each occurrence of the first symbol, the first symbol is mapped to the second symbol when the scrambling code has a 1 value, and the first symbol remains unchanged when the scrambling code has a 0 value.

10. The method of claim 7, wherein the scrambling code comprises a periodic pseudo-random bit stream of −1, 0, and 1 values, wherein the −1 and 1 values each have a 25% probability of occurrence, and wherein the 0 value has a 50% probability of occurrence.

11. The method of claim 10, wherein, for each occurrence of the first symbol, the first symbol is mapped to the second symbol when the scrambling code has a −1 or 1 value, and the first symbol remains unchanged when the scrambling code has a 0 value.

12. The method of claim 11, wherein, for each mapping of the first symbol to the second symbol, the symbol amplitude value of the mapped first symbol will be equal to the symbol amplitude value of the second symbol, a sign of the mapped first symbol will remain unchanged when the scrambling code has a 1 value, and the sign of the mapped first symbol will be reversed when the scrambling code has a −1 value.

13. The method of claim 1, wherein the first symbol has a ±1 value and the second symbol has a ±3 value.

14. The method of claim 1, wherein the series of quantized symbols represents a PAM4 signal.

15. The method of claim 1, wherein the series of digital samples is a digital DOCSIS signal.

16. A communication system, comprising:
a processor in communication with a memory device configured to store a plurality of instructions, which, when executed by the processor, cause the processor to:
obtain a delta-sigma digitization sampling frequency for a series of digital samples output from a communication stack of the communication system, the series of digital samples including K digital samples, where K is an integer greater than 1;
calculate an oversampling ratio, R, for the series of digital samples;
interpolate the series of digital samples at a rate equivalent to the oversampling ratio to generate a number of samples equal to R*K; and
quantize the interpolated series of digital samples to a plurality of discrete predetermined levels to generate a series of quantized symbols;
a transmitter portion configured to transmit a digitized stream of the quantized symbols over a digital optical link;
a mapping unit disposed within the transmitter portion and configured to code the digitized stream of quantized symbols with a mapping code prior to transmission over the digital optical link;
a receiver portion configured to recover the coded stream of quantized symbols from the digital optical link; and
a demapping unit disposed within the receiver portion and configured to map the recovered coded stream of quantized symbols into an uncoded digitized signal corresponding to the digitized stream of quantized symbols at the transmitter portion prior to coding by the mapping unit.

17. The system of claim 16, wherein the processor is configured to interpolate and quantize the series of digital samples as a single operation.

18. The system of claim 16, wherein the instructions further cause the processor to process at least two sequential samples of the series of digital samples simultaneously.

19. The system of claim 16, wherein the receiver portion comprises a digital-to-analog converter configured to convert the uncoded digitized signal into a recovered analog signal.

20. The system of claim 19, wherein the digital-to-analog converter is configured to implement delta-sigma demodulation on the uncoded digitized signal.

* * * * *